US007482893B2

(12) United States Patent
Itoh et al.

(10) Patent No.: US 7,482,893 B2
(45) Date of Patent: Jan. 27, 2009

(54) POWER COMBINERS USING META-MATERIAL COMPOSITE RIGHT/LEFT HAND TRANSMISSION LINE AT INFINITE WAVELENGTH FREQUENCY

(75) Inventors: Tatsuo Itoh, Rolling Hills, CA (US); Kevin M. K. H. Leong, Los Angeles, CA (US); Alexandre Dupuy, Nice (FR)

(73) Assignee: The Regents of the University of California, Oakland, CA (US)

( * ) Notice: Subject to any disclaimer, the term of this patent is extended or adjusted under 35 U.S.C. 154(b) by 75 days.

(21) Appl. No.: 11/744,160

(22) Filed: May 3, 2007

(65) Prior Publication Data

US 2008/0001684 A1 Jan. 3, 2008

Related U.S. Application Data

(60) Provisional application No. 60/802,089, filed on May 18, 2006.

(51) Int. Cl.
*H03H 7/46* (2006.01)

(52) U.S. Cl. ...................................... 333/110; 333/117

(58) Field of Classification Search ................. 333/100, 333/124, 117, 118, 219, 236, 246
See application file for complete search history.

(56) References Cited

U.S. PATENT DOCUMENTS

| | | | | |
|---|---|---|---|---|
| 4,565,984 | A | 1/1986 | Castera et al. | |
| 5,872,491 | A | 2/1999 | Kim et al. | |
| 6,472,950 | B1 | 10/2002 | London | |
| 7,391,288 | B1 * | 6/2008 | Itoh et al. | 333/219 |
| 2002/0167372 | A1 | 11/2002 | Ishizaki et al. | |
| 2003/0071697 | A1 | 4/2003 | Souetinov et al. | |
| 2004/0066251 | A1 | 4/2004 | Eleftheriades et al. | |
| 2004/0140862 | A1 | 7/2004 | Brown et al. | |
| 2005/0253667 | A1 | 11/2005 | Itoh et al. | |
| 2006/0066422 | A1 | 3/2006 | Itoh et al. | |
| 2008/0048917 | A1 * | 2/2008 | Achour et al. | 343/700 MS |
| 2008/0204327 | A1 * | 8/2008 | Lee et al. | 343/700 MS |

* cited by examiner

*Primary Examiner*—Don P Le
(74) *Attorney, Agent, or Firm*—John P. O'Banion

(57) ABSTRACT

Power combining methods and devices for tunnel diode oscillators using the infinite wavelength phenomenon observed in composite right/left-handed (CRLH) meta-material lines are described. One implementation utilizes a series combiner composed of zero degree lines, with each oscillator output port connected directly to the line and combined in-phase, to equally combine the power in phase. In a second implementation, a section of zero degree transmission line implements a stationary wave resonator with oscillators loosely coupled to the resonator, where the wave amplitude and phase are constant along the line. In one test of this second implementation a maximum power combining efficiency of 131% was obtained with the zero$^{th}$ order resonator with two tunnel diodes oscillators at 2 GHz.

56 Claims, 3 Drawing Sheets

POWER COMBINERS USING META-MATERIAL COMPOSITE RIGHT/LEFT HAND TRANSMISSION LINE AT INFINITE WAVELENGTH FREQUENCY

CROSS-REFERENCE TO RELATED APPLICATIONS

This application claims priority from U.S. provisional application Ser. No. 60/802,089 filed on May 18, 2006, incorporated herein by reference in its entirety.

STATEMENT REGARDING FEDERALLY SPONSORED RESEARCH OR DEVELOPMENT

This invention was made with Government support under Contract/Grant No. N00014-01-1-0803, awarded by the Office of Naval Research. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to power dividing and combining, and more particularly to power combining tunnel diode oscillators using a meta-material transmission line at infinite wavelength frequency.

2. Description of Related Art

Power combiners are used to deliver more output power than can be achieved utilizing a single output device. Series combiners are widely used to combine power amplifiers, antennas, oscillators, and the like, because of their abilities to combine the signal in phase. Combining the signals in phase requires setting the spacing between each port at a specific portion of the wavelength, such as at $\lambda$ or $\lambda/2$. A power divider performs the inverse operation, wherein it delivers power from a single input port to multiple output ports. Series power dividers are less complex and more compact than parallel power dividers. The advantage of series dividers increases as the number of output ports increases and the physical area for the feed network is limited. Series dividers deliver power equally and in phase to all output ports. Series dividers can be used in a number of applications, such as to feed antenna arrays, for clock synchronization and within radio receiver circuits.

Therefore, a need exists for a divider/combiner apparatus and method which can be implemented in a compact form while not requiring fixed wavelength positioning within the series connection. The present invention fulfills that need, and overcomes the deficiencies of previously developed combiners and dividers.

BRIEF SUMMARY OF THE INVENTION

Power dividing/combining apparatus, circuits and methods are described, for devices such as for tunnel diode oscillators, using the infinite wavelength phenomenon observed in composite right/left-handed (CRLH) meta-material lines. At this frequency, the electrical length of the transmission line is zero degrees corresponding to an infinitely long wavelength.

An N-port power divider/combiner is implemented utilizing the infinite wavelength properties of a meta-material transmission line. The structure is based on a composite Right/Left-Handed (CRLH) transmission line (TL) which possesses either the propagation properties of a purely right-handed (RH) (phase delay) or a purely left-handed (LH) (phase advance) TL depending on the frequency. The transition frequency between the RH and LH regions is a point at which the propagation constant is equal to zero ($\beta=0$). Thus at this transition frequency an infinite wavelength can exist, at which frequency both the phase and amplitude of a wave propagating along the line are independent of position, while a line utilized as a resonator supports a stationary wave.

A series combiner is described employing zero degree lines with each oscillator output port connected directly to the zero degree line in which the oscillator signals are combined in-phase. This circuit is able to equally combine the power inputs in-phase regardless of the position and the numbers of ports along the CRLH transmission line and to mode lock the different oscillating modes together through nonlinear interactions among the mode fields.

In one aspect of the invention may comprise a section of zero degree transmission line utilized to implement a stationary wave resonator, the oscillators (or other RF sources) are loosely coupled to the resonator, and the resonant characteristics are used to reduce the combined oscillator phase noise. In tests (and not by way of limitation), a maximum power combining efficiency of 131% was obtained with the zeroeth-order resonator configured with two tunnel diode oscillators at 2 GHz.

In another aspect of the invention is a series divider employing zero degree lines which distribute equally and in phase the signal at the input port to the output ports. This circuit is able to equally divide the power in-phase regardless of the position and the numbers of ports along the CRLH transmission line. The physical length of the divider or the position of the power taps has no effect on the phase and power balance between each output port.

In another aspect of the invention is a section of zero degree transmission line utilized for implementing a stationary wave resonator, wherein the input signal is loosely coupled to the resonator, and the resonant characteristics are used to couple energy to the output ports equally and in phase. By way of example and not limitation, three and five port series dividers were implemented which demonstrate equal power splitting independent of tap location.

Injection locking measurements show that the series combiner may be used for tunable oscillators where the zeroeth order resonator may be used for higher Q oscillations.

One embodiment of the invention is an apparatus comprising: (a) a zero degree composite right/left hand (CRLH) transmission line (TL); (b) wherein the transmission line is configured with a plurality of ports for input and output, wherein the ports for input are configured for receiving output signals from corresponding devices; (c) the apparatus comprises either a combiner formed with multiple ports for input and one port for output, or a divider formed with a single port for input and multiple ports for output; (d) in the case of the combiner, the input signals received on the ports for input into the combiner are combined in-phase by said transmission line to generate an output signal on the port for output; (e) in the case of the divider, the input signal received on said input port into said divider are divided equally and in-phase by said transmission line to generate output signals at each of the ports for output.

At least one embodiment of the invention is a power combiner comprising: (a) a zero degree composite right/left hand (CRLH) transmission line (TL); (b) wherein the transmission line is configured with an output port and a plurality of input ports configured for receiving output signals from corresponding input devices; and (c) wherein input signals received on said input ports are combined in-phase by the transmission line to generate an output signal at the output port. In one mode of the invention an impedance matching transformer is coupled to each input port, having a length of one-quarter wavelength corresponding to the output frequency of an associated oscillator. In this combiner, each of the input ports is configured for receiving signals from an oscillator, or other RF source. Oscillator output signals received on the input ports of the combiner are combined in-phase by the transmission line to generate an output signal at the output port.

In another embodiment, a power combiner includes a composite right/left hand (CRLH) transmission line (TL) configured as a zeroeth order resonator, the transmission line has an open-circuited first end, a loosely coupled output port at a second end, and multiple loosely coupled input ports, where each of the input ports is configured for receiving signals from an oscillator, and where oscillator output signals received on the input ports are combined in-phase by the transmission line to generate an output signal at the output port.

In at least one preferred embodiment, the oscillators comprise tunnel diode oscillators. In one mode of the invention, the output port is impedance matched to a specific impedance, such as fifty ohms. In another mode of the invention, each input port is impedance matched to a corresponding oscillator. In another mode of the invention, an impedance matching transformer is coupled to each said input port, such as implemented with each transformer having a length of one-quarter wavelength corresponding to the output frequency of the corresponding oscillator.

Another embodiment is a power divider comprising: (a) a composite right/left hand (CRLH) transmission line (TL); (b) the transmission line having an input port and a plurality of output ports configured for outputting signals to corresponding devices; (c) wherein input signals received on said input port are divided equally and in-phase by said transmission line to generate output signals at each said output port. In one mode of the invention the output port connection of the TL is controlled by a switch, such as comprising a diode.

It should be appreciated that the above embodiments and modes of combiners are not limited to use with oscillators, and may be utilized for combining any desired outputs, such as that of power amplifiers, antenna arrays, and so forth.

It should also be appreciated that the above embodiments and modes of divider are similarly not limited to use with an input from an oscillator, and whose outputs may be directed at any desired devices, such as antenna arrays, clock synchronization circuits, and radio receiver circuits.

An aspect of the present invention is a structure utilized as either a series combiner or divider.

Another aspect of the invention is a body of the combiner/divider formed from segments of a CRLH-TL operating at the infinite wavelength frequency.

Another aspect of the invention is a combiner in which all the input ports can be combined in phase without the need of retaining specific distances between the input ports of the combiner.

Another aspect of the invention is a divider in which the input signal is divided equally and in-phase between all the output ports without the need of retaining specific distances between the output ports.

Another aspect of the invention is an open-ended CRLH-TL as a zeroeth-order resonator which receives input, such as from tunnel diode oscillators, which are loosely-coupled to the resonator, while power is extracted from one end of the resonator.

Another aspect of the invention is a open-ended CRLH-TL as a zeroeth-order resonator utilizing coupling capacitors, such as in the picofarad range, on the input and output ports.

Another aspect of the invention is a CRLH TL combiner/divider which provides a periodic structure comprising a right-handed series inductance $L_R$ and shunt capacitance $C_R$ (as in a conventional transmission line) and a left-handed series capacitance $C_L$ and shunt inductance $L_L$.

Another aspect of the invention is a CRLH-TL combiner/divider that incorporates lumped elements to model the left-handed capacitors, and shorted stubs, rather than lumped elements, to model the left-handed inductors in order to reduce loss.

Another aspect of the invention is a CRLH-TL combiner/divider having an RH portion of the line implemented utilizing microstrip line of an electrical length that provides the proper RH phase.

Another aspect of the invention is a CRLH-TL combiner/divider having an output port, or input port, respectively, having a specific impedance, such as 50 ohms.

Another aspect of the invention is a CRLH-TL combiner/divider in which a signal is received from a tunnel diode oscillator coupled through a shorted stub to act as an inductor to cancel out the capacitance and set the oscillation frequency.

Another aspect of the invention is a combiner/divider having improved phase noise characteristics, over conventional combiner/divider configurations, in response to the filtering provided by the CRLH-TL.

Another aspect of the invention is a CRLH-TL combiner/divider which provides mode locking for a given bandwidth.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1:
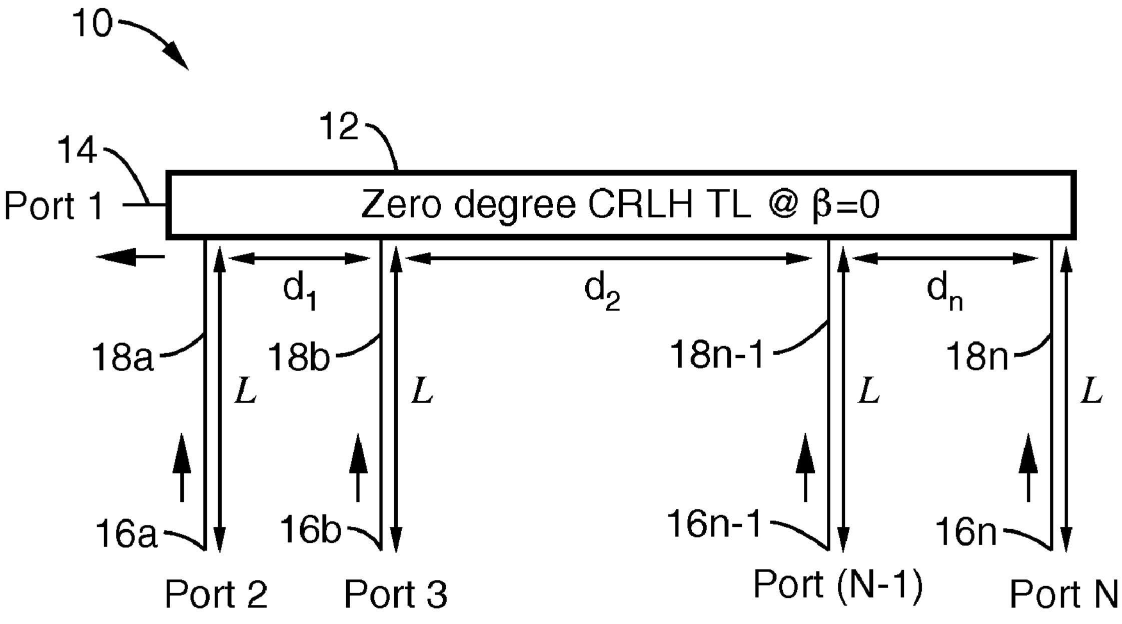
FIG. 1 is a schematic diagram of a balanced CRLH transmission line at $\beta=0$ power combiner, according to an embodiment of the invention.

Referring more specifically to the drawings, for illustrative purposes the present invention is embodied in the apparatus generally shown in FIG. 1 through FIG. 6. It will be appreciated that the apparatus may vary as to configuration and as to details of the parts, and that the method may vary as to the specific steps and sequence, without departing from the basic concepts as disclosed herein.

1. Introduction.

The present invention comprises power combining (dividing) schemes based on the existence of the infinite wavelength frequency. By way of example and not limitation, two implementations of the power combining schemes are described and compared. The first embodiment uses the segments of a CRLH-TL as part of a series combiner to combine the power of several tunnel diode oscillators. Using this structure, each diode can be optimally combined as all ports along the line are in phase. The second embodiment utilizes an open-ended CRLH-TL as a zero$^{th}$ order resonator ($\beta/=0$). In this structure, the tunnel diode oscillators are loosely-coupled to the meta-material resonator and power is extracted through one end of the resonator. Since a stationary wave is supported, all diodes are again combined in phase. Furthermore, since the stationary wave maintains an equal voltage across the entire resonator, it is less susceptible to series losses along the line. Therefore, if additional loss is applied to the line, only the infinite wavelength mode remains while other resonant modes are suppressed. This is beneficial as it creates high-Q oscillations and also may reduce harmonics. Experimental data for the two schemes is also presented and compared.

2. Design and Implementation Of Oscillator Power Combiners.

The power combining structures described herein are based on CRLH-TL structures operating at the infinite wavelength frequency, where $\beta=0$ at $\omega\neq0$.

2.1 CRLH Theory.

A CRLH TL can be viewed as a periodic structure comprised of a right-handed series inductance $L_R$ and shunt capacitance $C_R$ (conventional transmission line) and a left-handed series capacitance $C_L$ and shunt inductance $L_L$. In the unbalanced case, where $L_RC_L\neq L_LC_R$, there exists two different resonant frequencies $\omega_{se}$ and $\omega_{sh}$ that can support an infinite wavelength given by:

$$\omega_{sh} = \frac{1}{\sqrt{C_R L_L}} \text{ and } \omega_{se} = \frac{1}{\sqrt{C_L L_R}}. \quad (1)$$

At $\omega_{se}$ and $\omega_{sh}$ the group velocity ($vg=d\omega/d\beta$) is zero and the phase velocity $vp=\omega/\beta$) is infinite. In the balanced case when $L_RC_L=L_LC_R$ the resonant frequencies coincide and $\omega_{se}=\omega_{sh}$.

2.2 Design of Power Combiner Unit Cell.

A zero-degree CRLH-TL was implemented according to: A. Sanada, C. Caloz, and T. Itoh, "Zeroth Order Resonance in CRLH TL Resonance in the Left-Handed Transmission Line," *IEICE Trans. Electron.*, vol. E87-C, NO. 1, pp. 1-7, January 2004, incorporated herein by reference in its entirety, at 2 GHz in order to find the values of $L_R$, $C_R$, $L_L$ and $C_L$.

The CRLH-TLs can be implemented using either distributed or lumped elements that fit the prescribed infinitesimal model so that each unit cell is less than $\lambda/10$. By way of example, lumped elements were used to model the left-handed capacitors, and the left-handed inductors were implemented utilizing shorted stubs rather than lumped elements in order to reduce losses. The RH portion of the line is implemented by using a microstrip line of electrical length that provides the proper RH phase. The calculated parameters are, $C_L=2$ pF, $L_L=5$ nH, $C_R=1.3$ pF and $L_R=3.3$ nH. As $L_RC_L=L_LC_R$, this unit cell is balanced. The CRLH-TL was fabricated, by way of example, on a substrate comprising RT/Duroid with h=31 mil, $\epsilon_r=2.33$.

2.3 Series Power Combiner Using Zero-Degree Lines.

FIG. 1 illustrates an example embodiment 10 of the inventive series combiner circuit. A CRLH TL 12 is shown with output port 14 (Port 1) impedance matched to 50Ω while the other ports, 16*a*, 16*b*, 16*n*-1, 16*n*, are matched to the optimum impedance of the tunnel diode oscillator, which is then transformed via a quarter wavelength transformer 18*a*, 18*b*, 18*n*-1, 18*n*, of length L at the fundamental frequency.

Each oscillator port is connected using either a segment or multiple segments of CRLH-TL units, as discussed in the previous section, to ensure that each oscillator can be combined at the output port in phase. Notice that the distance between each port: $d_1, d_2, \ldots, d_n$ can be arbitrary, while still providing in-phase power combining due to the fact that $\beta=0$ at the operational frequency. The arbitrary spacing eases constraints on combiner layout and oscillator spacing.

It should be appreciated that in a divider configuration of the apparatus, port 14 is an input port while ports 16*a*, 16*b*, 16*n*-1 and 16*n* are output ports. Input port 14 is preferably impedance matched, such as to 50Ω, while the output ports are matched to the optimum impedance of the corresponding devices receiving the output signal.

Figure 2:
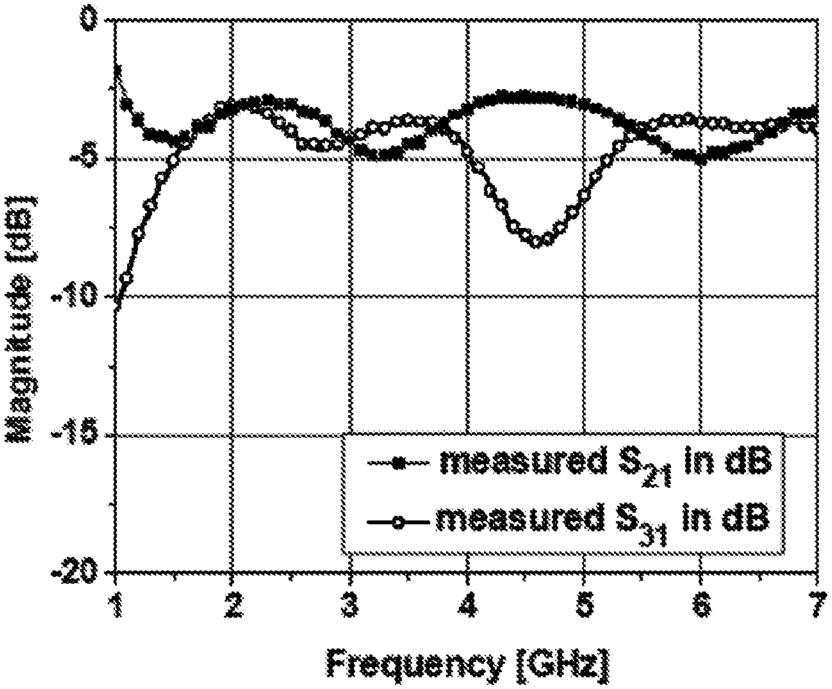
FIG. 2 is a graph of measured s-parameter magnitudes for the balanced CRLH series combiner of FIG. 1, shown using zero degree lines with two ports.

FIG. 2 illustrates measured S-parameters for the CRLH zero degree line with two ports. Port 1 is the output port, and at 2 GHz, the measured phases and magnitudes are: $S_{21}=-89.9°$, $S_{31}=-91.6°$, $|S_{21}|=-3.056$ dB and $|S_{31}|=-3.247$ dB. The observed loss can be attributed to the losses in the capacitor used to implement the LH capacitance. Two additional configurations of series combiners according to the present invention were also fabricated and measured. The first was an evenly spaced three-port combiner with measured phases and magnitudes of: $S_{21}=-102.96°$, $S_{31}=-102°$, $S_{41}=-102.67°$, $|S_{21}|=-4.892$ dB, $|S_{31}|=-5.195$ dB and $|S_{41}|=-4.915$ dB. The second was an unevenly spaced three port combiner with measured phases and magnitudes: $S_{21}=95°$, $S_{31}=-88°$, $S_{41}=-90.3°$, $|S_{21}|=-5.019$ dB, $|S_{31}|=-5.335$ dB and $|S_{41}|=-5.022$ dB. These two structures have a loss of 0.3 dB due to the lumped element capacitors. It will be appreciated that the effect is more noticeable as the number of unit cells increases. Results can be improved by the use of lower-loss capacitors and/or the use of distributed lines.

2.4 Zero$^{th}$-Order Resonator Power Combiner.

Figure 3:
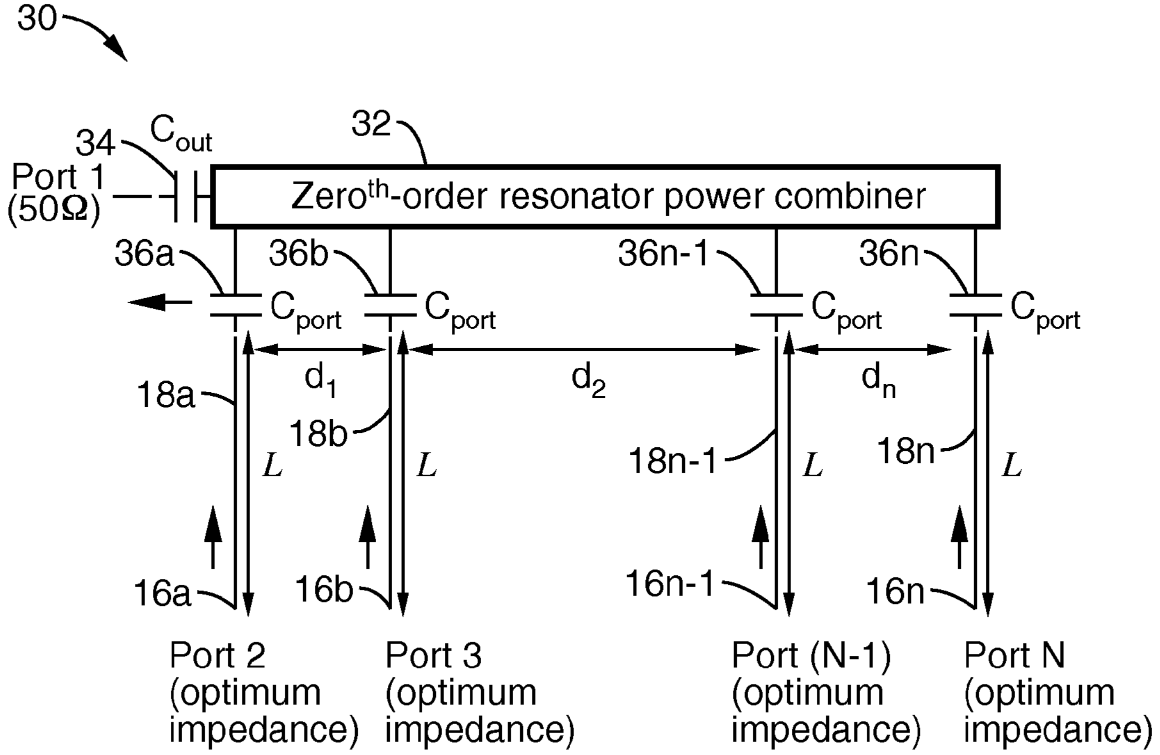
FIG. 3 is a schematic diagram of a balanced CRLH transmission line at $\beta=0$ as a zeroeth-order resonator power combiner, according to an embodiment of the invention.

FIG. 3 illustrates an example embodiment 30 of a preferred configuration of zero$^{th}$-order resonator 32 utilizing the same unit cell as described in section 2.2. However, the length of the CRLH-TL in this configuration acts as a resonator by having one of its ends open circuited and loosely coupling an output port and oscillator ports to the structure. In this example, the value of coupling capacitors 36$a$, 36$b$, 36$n$-1, and 36$n$, used at each port to tap the power is 3 pF, while the coupling capacitor 34 at the output of the power combiner is 5 pF. It is considered that this structure provides additional filtering for the oscillators toward reducing phase noise. Furthermore, since the resonance appears as a stationary wave it is less susceptible to series losses in the line since voltage is constant along the line.

It should also be appreciated that in a divider configuration, capacitor 34 is at the input port with capacitors 36$a$, 36$b$, 36$n$-1 and 36$n$ are at the output ports of the device.

Figure 4:
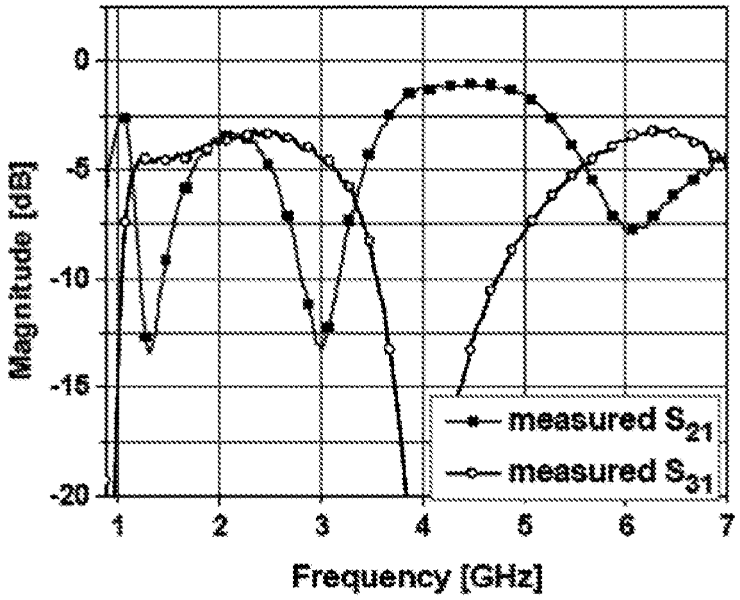
FIG. 4 is a graph of measured s-parameter magnitudes for the zeroeth-order CRLH resonator power combiner of FIG. 3, shown as having two ports.

FIG. 4 is a graph of the zero$^{th}$-order power combiner shown having two ports configured as two cascaded unit cells, as determined in section 2.1. The measured S-parameters at 2 GHz for the combiner shown in FIG. 3 are: $S_{21}$=−66.7°, $S_{31}$=−67.5°, $|S_{21}|$=−3.5 dB and $|S_{31}|$=−3.6 dB.

3. Oscillator Power Combining Measurements.

Tunnel diodes (e.g., Metelics Corporation M1X1168 tunnel diodes) were utilized within a 2 GHz oscillator design. The tunnel diode has the ability to oscillate because of the negative slope of its I-V characteristic, which are similar to the Resonant Tunnel Diode described by C. Kider, I. Mehdi, J. R. East, and G. I Haddad, "Power and stability limitations of resonant, tunneling diodes," *IEEE Trans. Microwave Theory & Tech.*, vol. 38, No. 1, pp. 864-872, January 1990, incorporated herein by reference in its entirety.

The tunnel diode can be modeled as a negative resistor and capacitor in parallel as described by O. Boric-Lubecke, Dee-Son Pan, and T. Itoh, "RF Excitation of an Oscillator with Several Tunneling Devices in Series," *IEEE Microwave and Guided Wave Letters*, vol. 4, NO. 11, pp. 364-366, November 1994, incorporated herein by reference in its entirety. A shorted stub is inserted in series with the diode to act as an inductor to cancel out the capacitance and set the oscillation frequency. For maximum oscillation power, the output of the diode is set to the optimum power impedance, which in this case is 50 Ω. The tunnel diode in free-running oscillation at 2 GHz has a maximum output power of −26 dBm.

Figure 5:
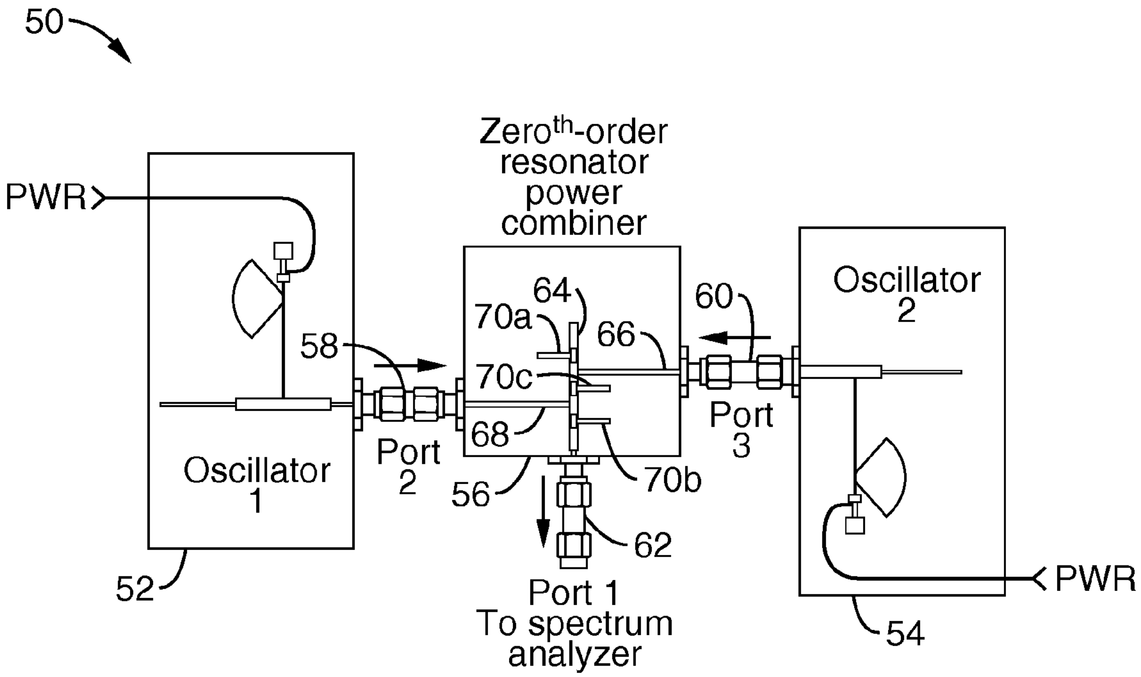
FIG. 5 is a block diagram of an experimental setup using a two-port zeroeth-order resonator power combiner with tunnel diode oscillators, according to an aspect of the present invention.

FIG. 5 illustrates an example embodiment 50 of a configuration utilized for testing power combiner embodiments. A first oscillator 52 and second oscillator 54 are shown coupled to a combiner 56 through ports 58, 60, respectively. The output of the combiner is coupled through output port 62 to measuring equipment (not shown), such as a spectrum analyzer. Combiner 56 is shown with transformers 66, 68 leading from ports 60, 58, respectively, onto TL section 64 having connected diodes, such as represented by 70$a$, 70$b$, and 70$c$. In this example the tunnel diodes were individually biased at 0.2 V.

Table 1 presents the output power of the different schemes compared to a single tunnel diode oscillator at the fundamental frequency as well as the 2$^{nd}$ and 3$^{rd}$ harmonics. A higher power combining efficiency is obtained with the zero$^{th}$ order resonator power combiner due to the filtering effect previously described. For a single diode, the 3$^{rd}$ harmonic is −14.83 dB lower than the fundamental. For the zero$^{th}$ order resonator power combiner with two tunnel diodes oscillators, the 3$^{rd}$ harmonic is −26.33 dB.

Table 2 displays the phase noise of the different power combiners studied. In this measurement, the filtering effect is more apparent. For a 10 kHz offset frequency there is an improvement of 9.17 dB in the case of two tunnel diodes connected to the zero$^{th}$ order resonator compared to the case of two diodes connected to the zero-degree line.

External locking was accomplished by using the synthesizer sweeper (e.g., HP83621) with a 10 dB external directional coupler providing −35 dBm locking power. For the series zero-degree CRLH TL power combiner with two tunnel diodes, the mode locking is maintained for a bandwidth of 12 MHz. Whereas, for the zero$^{th}$ order resonator power combiner with two diodes, the mode locking is maintained for a bandwidth of 8 MHz. These different measurements confirm the statement made previously that the zero$^{th}$ order resonator power combiner provides a filtering effect to lock in the oscillator frequency.

Figure 6:
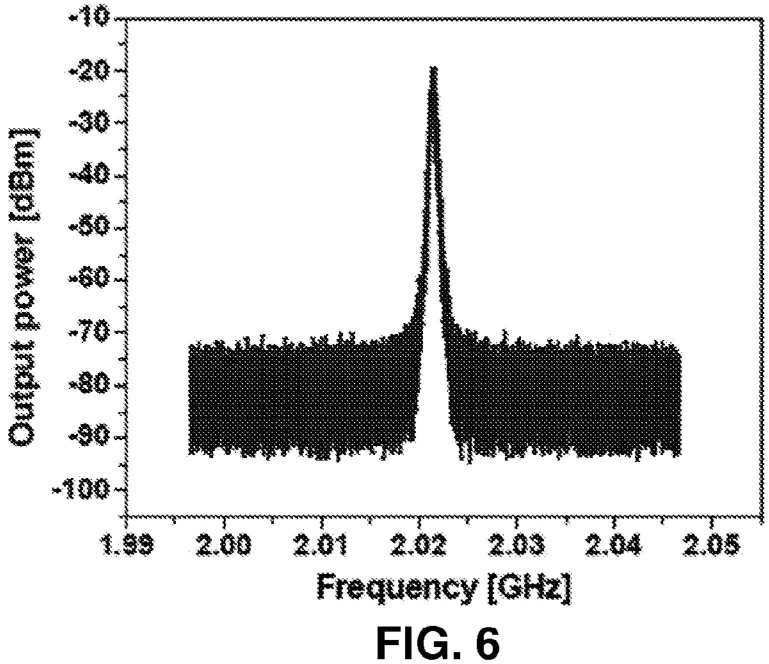
FIG. 6 is a graph of the output spectrum of two tunnel diode oscillators mode locked using a zeroeth order resonator power combiner, according to an aspect of the present invention.

FIG. 6 illustrates the spectrum of the two tunnel diodes oscillator mode locked using the zero$^{th}$ order resonator power combiner.

4. Conclusion.

The foregoing describes various embodiments of power combining methods and devices for tunnel diode oscillators using the infinite wavelength phenomenon. In one embodiment, a series combiner comprising zero degree lines is used. Each oscillator output port is connected directly to the line and combined in-phase. Demonstration of equally and unequally spaced oscillators were shown. In another embodiment, a section of zero degree transmission line was used to implement a stationary wave resonator. In this case, oscillators were loosely coupled to the resonator. The resonant characteristics are used to reduce the combined oscillator phase noise. A maximum power combining efficiency of 131% was obtained with the zero$^{th}$ order resonator having two tunnel diodes and oscillating at 2 GHz. Injection locking measurements show that the method using zero-degree line series combiner may be used for a tunable oscillator whereas the zero$^{th}$ order resonator may be used for higher-Q oscillators.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art. In the appended claims, reference to an element in the singular is not intended to mean "one and only one" unless explicitly so stated, but rather "one or more." All structural and functional equivalents to the elements of the above-described preferred embodiment(s) that are known to those of ordinary skill in the art are expressly incorporated herein by reference and are intended to be encompassed by the disclosure and claims. Moreover, it is not necessary for a device or method to address each and every problem sought to be solved by the present invention, for it to be encompassed by the present disclosure and claims. Furthermore, no element, component, or method step in the present disclosure is intended to be dedicated to the public regardless of whether the element, component, or method step is explicitly recited in the disclosure or claims. No claim element herein is to be construed under the provisions of 35 U.S.C. 112, sixth paragraph, unless the element is expressly recited using the phrase "means for."

TABLE 1

Power Comparison Between Zero$^{th}$ Order Resonator Power Combiner and Zero Degree CRLH TL

| Number of diodes connected to power combiner | $f_0$ (2 GHz) | $2f_0$ (dBm) | $3f_0$ | Combining efficiency |
|---|---|---|---|---|
| 1 | −26.17 | −48 | −41 | — |
| 2 (zero degree line) | −22.17 | −45 | −36.5 | 125% |
| 3 evenly spaced (zero degree line) | −20.83 | −44.83 | −37.67 | 114% |

TABLE 1-continued

Power Comparison Between Zero$^{th}$ Order Resonator Power Combiner and Zero Degree CRLH TL

| Number of diodes connected to power combiner | $f_0$ (2 GHz) | $2f_0$ (dBm) | $3f_0$ | Combining efficiency |
|---|---|---|---|---|
| 3 unevenly spaced (zero degree line) | −21 | −43.67 | −38.17 | 109.6% |
| 2 (zero$^{th}$ order resonator) | −22 | −45 | −48.33 | 131% |
| 2 (zero$^{th}$ order resonator with a 22 Ω resistor) | −23 | −47 | −50.5 | 103.9% |

TABLE 2

Phase Noise Comparison

| Number of diodes connected to power combiner | 10 kHz | 100 kHz (dBc) | 1 MHz |
|---|---|---|---|
| 1 | −12.17 | −41.17 | −68.83 |
| 2 (zero degree line) | −37.17 | −61.5 | −70.83 |
| 3 evenly spaced (zero degree line) | −40.83 | −61.67 | −73.67 |
| 3 unevenly spaced (zero degree line) | −43.0 | −58.0 | −72.33 |
| 2 (zero$^{th}$ order resonator) | −46.34 | −62.17 | −75.5 |
| 2 (zero$^{th}$ order resonator - with a 22 Ω resistor) | −45.5 | −64.83 | −73.17 |

What is claimed is:

1. An apparatus, comprising:

a zero degree composite right/left hand (CRLH) transmission line (TL);

said transmission line having a plurality of ports for input and output; and said ports for input are configured for receiving output signals from corresponding devices;

wherein said apparatus comprises a combiner formed with multiple ports for input and one port for output, or said apparatus comprises a divider formed with a single port for input and multiple ports for output;

wherein input signals received on said ports for input into said combiner are combined in-phase by said transmission line to generate an output signal on said port for output; and wherein input signal received on said input port into said divider are divided equally and in-phase by said transmission line to generate output signals at each said port for output.

2. A power combiner, comprising:

a zero degree composite right/left hand (CRLH) transmission line (TL);

said transmission line having an output port;

said transmission line having a plurality of input ports;

each said input port configured for receiving output signals from corresponding input devices;

wherein input signals received on said input ports are combined in-phase by said transmission line to generate an output signal at said output port.

3. A power combiner as recited in claim 2, wherein said signals are received from a device selected from the group of RF devices consisting of: oscillators, tunnel diode oscillators, antennas, signal amplifiers, FET devices, and integrated circuits.

4. A power combiner as recited in claim 2, wherein said transmission line has an electrical length equivalent to an infinitely long wavelength.

5. A power combiner as recited in claim 2, wherein said CRLH transmission line comprises lumped capacitance and inductance.

6. A power combiner as recited in claim 2, wherein said CRLH transmission line is configured with printed microstrip elements.

7. A power combiner as recited in claim 2, wherein said CRLH transmission line is configured with microstrip, stripline, CPW or LTCC technologies.

8. A power combiner as recited in claim 2, wherein said output port is impedance matched to fifty ohms.

9. A power combiner as recited in claim 2, wherein each said input port is impedance matched to a corresponding oscillator.

10. A power combiner as recited in claim 2, further comprising:

an impedance matching transformer coupled to each said input port;

wherein each said transformer is configured having a length of one-quarter wavelength corresponding to the output frequency of an associated oscillator.

11. A power combiner as recited in claim 2, wherein said transmission line comprises a meta-material.

12. A power combiner, comprising:

a composite right/left hand (CRLH) transmission line (TL) configured as a zeroeth order resonator;

said transmission line having an open circuited first end;

said transmission line having a loosely-coupled output port at a second end;

said transmission line having a plurality of loosely-coupled input ports; and each said input port configured for receiving output signals from corresponding devices;

wherein input signals received on said input ports are combined in-phase by said transmission line to generate an output signal at said output port.

13. A power combiner as recited in claim 12, wherein said signals are received from a device selected from the group of RF devices consisting of: oscillators, tunnel diode oscillators, antennas, signal amplifiers, FET devices, and integrated circuits.

14. A power combiner as recited in claim 12, wherein said transmission line has an electrical length equivalent to an infinitely long wavelength.

15. A power combiner as recited in claim 12, wherein said CRLH transmission line is built using lumped capacitance and inductance.

16. A power combiner as recited in claim 12, wherein said CRLH transmission line is configured with printed microstrip elements.

17. A power combiner as recited in claim 12, wherein said CRLH transmission line is configured with microstrip, stripline, CPW or LTCC technologies.

18. A power combiner as recited in claim 12, wherein said output port is impedance matched to fifty ohms.

19. A power combiner as recited in claim 12, wherein each said input port is impedance matched to a corresponding oscillator.

20. A power combiner as recited in claim 12, further comprising:

an impedance matching transformer coupled to each said input port;

wherein each said transformer is configured having a length of one-quarter wavelength corresponding to the output frequency of an associated oscillator.

21. A power combiner as recited in claim 12, wherein said transmission line comprises a meta-material.

22. A power divider, comprising:

a composite right/left hand (CRLH) transmission line (TL);

said transmission line having an input port;

said transmission line having a plurality of output ports;

each said output port configured for outputting signals to corresponding devices;

wherein an input signal received on said input port is divided equally and in-phase by said transmission line to generate output signals at each said output port.

23. A power divider as recited in claim 22, wherein said input signal is received from a device selected from the group of RF devices consisting of: an oscillator, tunnel diode oscillator, antenna, signal amplifier, FET device, and integrated circuit.

24. A power divider as recited in claim 22, wherein said output signals are coupled to devices selected from the group of RF devices consisting of: antenna arrays, clock synchronization circuits, and radio receiver circuits.

25. A power divider as recited in claim 22, wherein said transmission line has an electrical length equivalent to an infinitely long wavelength.

26. A power divider as recited in claim 22, wherein said CRLH transmission line comprises lumped capacitance and inductance.

27. A power divider as recited in claim 22, wherein said CRLH transmission line is configured with printed microstrip elements.

28. A power divider as recited in claim 22, wherein said CRLH transmission line is configured with microstrip, stripline, CPW or LTCC technologies.

29. A power divider as recited in claim 22, wherein said input port is impedance matched to fifty ohms.

30. A power divider as recited in claim 22, wherein each said output port is impedance matched to a corresponding output device.

31. A power divider as recited in claim 22, further comprising:

an impedance matching transformer coupled to each said output port;

wherein each said transformer is configured having a length of one-quarter wavelength corresponding to the output frequency of an associated device.

32. A power divider as recited in claim 22, wherein said transmission line comprises a meta-material.

33. A power divider, comprising:

a composite right/left hand (CRLH) transmission line (TL) configured as a zeroeth order resonator;

said transmission line having an open circuited first end;

said transmission line having a loosely-coupled input port at a second end;

said transmission line having a plurality of loosely-coupled output ports; and said input port configured for receiving an output signal from a device;

wherein an input signal received on said input port is divided equally and in-phase by said transmission line to generate output signals at said output ports.

34. A power divider as recited in claim 33, wherein said signals are received from a device selected from the group of RF devices consisting of: oscillators, tunnel diode oscillators, antennas, signal amplifiers, FET devices, and integrated circuits.

35. A power divider as recited in claim 33, wherein said output signals are coupled to devices selected from the group of RF devices consisting of: antenna arrays, clock synchronization circuits, and radio receiver circuits.

36. A power divider as recited in claim 33, wherein said transmission line has an electrical length equivalent to an infinitely long wavelength.

37. A power divider as recited in claim 33, wherein said CRLH transmission line is built using lumped capacitance and inductance.

38. A power divider as recited in claim 33, wherein said CRLH transmission line is configured with printed microstrip elements.

39. A power divider as recited in claim 33, wherein said CRLH transmission line is configured with microstrip, stripline, CPW or LTCC technologies.

40. A power divider as recited in claim 33, wherein said input port is impedance matched to fifty ohms.

41. A power divider as recited in claim 33, wherein each of said output ports is impedance matched to a corresponding device.

42. A power divider as recited in claim 33, further comprising:

an impedance matching transformer coupled to each said output port;

wherein each said transformer is configured having a length of one-quarter wavelength corresponding to the operating frequency of an associated device.

43. A power combiner as recited in claim 33, wherein said transmission line comprises a meta-material.

44. A power divider, comprising:

a zero degree composite right/left hand (CRLH) transmission line (TL) configured as a stationary wave resonator; and a plurality of output ports for coupling to corresponding output signals;

said output port connection of said TL is controlled by a switch;

wherein said input signal is divided equally and in-phase among connected output ports.

45. A power divider as recited in claim 44, wherein said signal is received from a device selected from the group of RF devices consisting of: oscillators, tunnel diode oscillators, antennas, signal amplifiers, FET devices, and integrated circuits.

46. A power divider as recited in claim 44, wherein said output signals are coupled to devices selected from the group of RF devices consisting of: antenna arrays, clock synchronization circuits, and radio receiver circuits.

47. A power divider as recited in claim 44, wherein said transmission line has an electrical length equivalent to an infinitely long wavelength.

48. A power divider as recited in claim 44, wherein said CRLH transmission line is built using lumped capacitance and inductance.

49. A power divider as recited in claim 44, wherein said CRLH transmission line is configured having printed microstrip elements.

50. A power divider as recited in claim 44, wherein said CRLH transmission line is configured with microstrip, stripline, CPW or LTCC technologies.

51. A power divider as recited in claim 44, wherein said input port is impedance matched to fifty ohms.

52. A power divider as recited in claim 44, wherein each said output port is impedance matched to an associated device.

53. A power divider as recited in claim 44, further comprising:

an impedance matching transformer coupled to each said output port;

wherein each said transformer is configured having a length of one-quarter wavelength corresponding to the output frequency of an associated output device.

54. A power divider as recited in claim 44, wherein said transmission line comprises a meta-material.

55. A power divider as recited in claim 44, wherein said switch is a diode.

56. A power divider as recited in claim 44, wherein said switch is a micro-electro-mechanical (MEMs) device.

* * * * *